(12) United States Patent
Sato et al.

(10) Patent No.: US 6,501,019 B2
(45) Date of Patent: Dec. 31, 2002

(54) ISOLATION APPARATUS FOR ELECTRONIC EQUIPMENT

(75) Inventors: Noriyoshi Sato, Yokohama (JP); Shinichi Terao, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/986,440

(22) Filed: Nov. 8, 2001

(65) Prior Publication Data

US 2002/0027009 A1 Mar. 7, 2002

Related U.S. Application Data

(62) Division of application No. 08/938,704, filed on Sep. 26, 1997, now Pat. No. 6,333,459.

(30) Foreign Application Priority Data

Sep. 26, 1996 (JP) .............................................. 8-254738

(51) Int. Cl.[7] ................................................ H05K 9/00
(52) U.S. Cl. ..................... 174/35 R; 361/816; 361/818; 361/800
(58) Field of Search .......................... 174/35 R, 35 GC; 361/799, 800, 816, 818; 455/90, 117; 343/841

(56) References Cited

U.S. PATENT DOCUMENTS

| | | | |
|---|---|---|---|
| 4,890,199 A | 12/1989 | Beutler | 361/424 |
| 5,150,282 A | 9/1992 | Tomura et al. | 361/424 |
| 5,438,482 A | 8/1995 | Nakamura et al. | 361/816 |
| 5,596,487 A | 1/1997 | Castaneda et al. | 361/814 |
| 5,642,413 A * | 6/1997 | Little | 340/7.6 |
| 5,717,577 A | 2/1998 | Mendolia et al. | 361/818 |
| 5,722,055 A | 2/1998 | Kobayashi et al. | 455/90 |
| 5,819,163 A | 10/1998 | Tsukamoto et al. | 455/90 |
| 5,874,920 A * | 2/1999 | Araki et al. | 343/702 |
| 6,333,459 B1 * | 12/2001 | Sato et al. | 174/35 GC |

FOREIGN PATENT DOCUMENTS

| | | |
|---|---|---|
| DE | 3515772 | 11/1986 |
| JP | 62-160599 | 10/1987 |
| JP | 4215500 | 8/1992 |
| JP | 8-70195 | 3/1996 |
| JP | 8-222881 | 8/1996 |

* cited by examiner

Primary Examiner—Dean A. Reichard
Assistant Examiner—Carmelo Oliva
(74) Attorney, Agent, or Firm—Israel Gopstein Clark & Brody

(57) ABSTRACT

An electromagnetic isolation apparatus for an electronic device such as a portable telephone is provided which includes first and second shield cases and elastic members such as rubber cushions. The first and second shield cases are disposed within a casing of the electronic device to surround at least part of both surfaces of a printed circuit board mounted within the electronic device. The elastic members are interposed between an inner wall of the casing of the electronic device and an outer surface of the first shield case and between the inner wall of the casing and an outer surface of the second shield case to produce elastic pressures urging the first and second shield cases into conductive engagement with the printed circuit board.

1 Claim, 5 Drawing Sheets

ISOLATION APPARATUS FOR ELECTRONIC EQUIPMENT

This application is a Division of application Ser. No. 08/938,704 filed Sep. 26, 1997 now U.S. Pat. No. 6,333,459.

BACKGROUND OF THE INVENTION

1. Technical Field of the Invention

The present invention relates generally to an electromagnetic isolation apparatus for electronic equipment such as a portable telephone, a cordless telephone, or a selective calling receiver which is designed to prevent undesired electromagnetic waves or noise from entering or leaking out of the electronic equipment.

2. Background Art

FIG. 5 shows a radio terminal unit having a conventional isolation structure which includes a shield case 1, a control circuit substrate 2, a radio circuit substrate 4 having mounted thereon radio communication circuit components 3 such as a transmitter and a receiver, a printed grounding conductor 5, and grounding terminals 6.

The control circuit substrate 2 has mounted thereon control circuit components and is attached to an upper wall of the shielding case 1. The shield case 1 is made of a molded resin case coated or plated with metal. The radio circuit substrate 4 is attached to the bottom of the shield case 1. This type of isolation structure is disclosed, for example, in Japanese Patent First Publication No. 4-215500.

The printed grounding conductor 5 is formed on the radio circuit substrate 4 and is connected to the shield case 1 through the grounding terminals 6. Each of the grounding terminals 6 has an elastically deformable conductive strip 7 engaging an inner wall of the shield case 1. Such a structure is disclosed, for example, in Japanese Utility Model First Publication The above isolation structure, however, has the following drawback. The substrates 2 and 4 are both thin, and the shield case 1 is made from resin material so that they are subject to setting or deformation. The attachment of the deformed substrate 2 or 4 to the shield case 1 will develop clearances therebetween through which undesired electromagnetic waves enter or leak out. In order to avoid this drawback, the prior art thus made it necessary to manufacture the substrates 2 and 4 and the shield case 1 with high accuracy, but such an approach results in an increase in manufacturing cost.

The elastically deformable conductive strips 7 of the grounding terminals 6 disposed between the radio circuit substrate 4 and the shield case 1 urge the substrate 4 to move away from the shield case 1, thereby increasing the clearance between the substrate 4 and the shield case 1. This causes more undesired electromagnetic waves to enter or leak out through the clearance, leading to malfunctions of, for example, the electronic components 3 or external circuits placed near the radio terminal unit.

The above isolation structure also uses two printed circuit boards, i.e., the control circuit substrate 2 and the radio circuit substrate 4, for improving the isolation performance. This type of printed circuit board is usually passed through a reflowing heater to mount thereon a plurality of electronic components. Different shapes of printed circuit boards encounter difficulty in passing through the same heater, however, thus requiring use of printed circuit boards of the same size or of different reflowing heaters, one for each printed circuit board. This results in an increase in design limitation or investment in plats and equipment.

SUMMARY OF THE INVENTION

It is therefore a principal object of the present invention to avoid the disadvantages of the prior art.

It is another object of the present invention to provide an improved isolation structure for an electronic device which is designed to isolate electronic components in the electronic device electromagnetically from the outside for preventing undesired electromagnetic waves from entering and leaking out of the electronic device.

According to one aspect of the present invention, there is provided an electromagnetic isolation apparatus for an electronic device having a casing within which a printed circuit board is mounted comprising: (a) a first shield case disposed within the casing of the electronic device to cover at least a portion of a first surface of the printed circuit board; (b) a second shield case disposed within the casing of the electronic device to cover at least a portion of a second surface of the printed circuit board opposite to the first surface; and (c) an elastic member interposed between an inner wall of the casing of the electronic device and a surface of one of the first and second shield cases so as to produce an elastic pressure urging the one of the first and second shield cases into engagement with a corresponding one of the first and second surfaces of the printed circuit board.

In the preferred mode of the invention, at least one of the first and second shield cases defines an enclosed chamber along with a corresponding one of the first and second surfaces of the printed circuit board within which an electronic component mounted on the printed circuit board is isolated electromagnetically.

The first and second shield cases are attached to each other to define an enclosed chamber surrounding at least a portion of each of the first and second surfaces of the printed circuit board.

Each of the first and second shield cases has a wall and side walls surrounding the wall to define a box-like conductive casing. Edge portions of the side walls of the first shield case engage edge portions of the side walls of the second shield case to define a chamber which surrounds the periphery of at least a portion of the printed circuit board.

A second elastic member is further provided which is interposed between a second inner wall of the casing of the electronic device opposite to the inner wall of the casing on which the elastic member is provided and a surface of the other of the first and second shield cases so as to produce an elastic pressure urging the other of the first and second shield cases into engagement with the other of the first and second surfaces of the printed circuit board.

The elastic member urges the one of the first and second shield cases into engagement with the corresponding one of the first and second surface of the printed circuit board to establish conductive communication between a portion of the one of the first and second shield cases and a grounding conductor printed on the printed circuit board.

One of the first and second shield cases has a wall and ribs extending from the wall to define at least one enclosed chamber along with a corresponding one of the first and second surface of the printed circuit board for electromagnetically isolating an electronic component disposed within the enclosed chamber.

A conductive spring member is further provided which is interposed between one of the first and second shield cases and a corresponding one of the first and second surfaces of the printed circuit board to establish conductive engagement therebetween.

The conductive spring member produces an elastic pressure urging the one of the first and second shield cases away from the printed circuit board against the elastic pressure provided by the elastic member. The elastic pressure provided by the conductive spring member is smaller than that provided by the elastic member so as to bring a portion of the one of the first and second shield cases and a portion of the corresponding one of the first and second surfaces of the printed circuit board into constant engagement with each other.

The one of the first and second shield cases has a wall and side walls surrounding the wall. Inside the side walls, ribs are formed on the wall, the ribs defining an enclosed chamber along with the corresponding one of the first and second surfaces of the printed circuit board. The conductive spring member is interposed between at least one of the ribs and the corresponding one of the first and second surfaces of the printed circuit board.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment shown therein but are provided only for the purpose of explanation and understanding.

In the drawings.

DESCRIPTION OF THE PREFERRED EMBODIMENT

Figure 1:
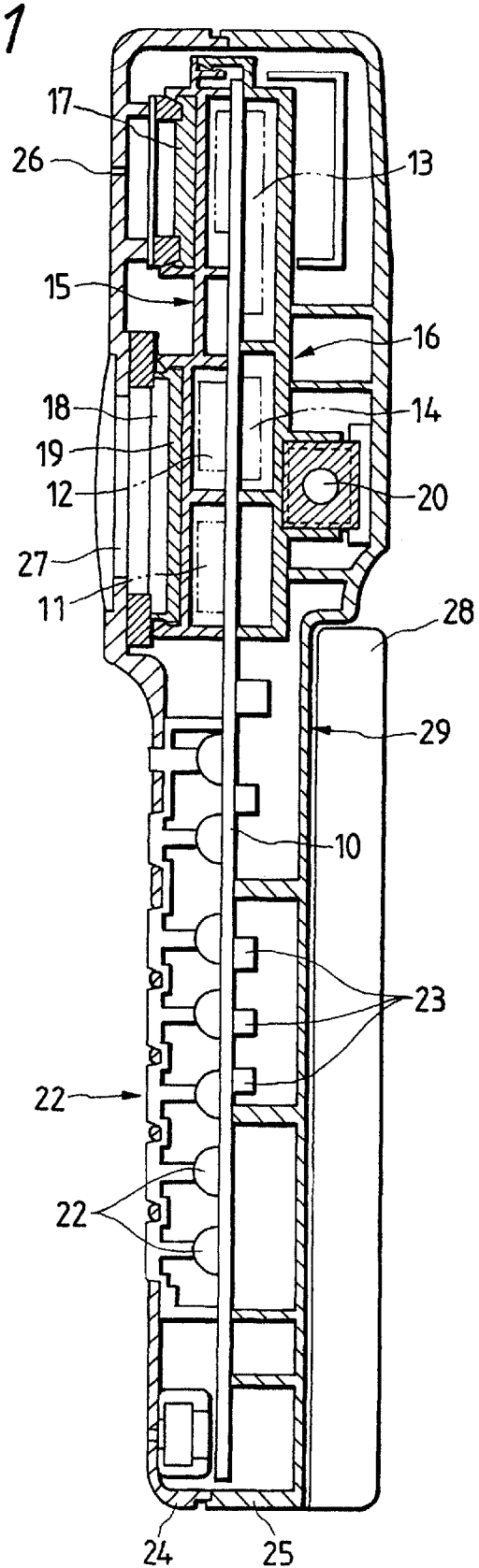
FIG. 1 is a vertical cross sectional view which shows a portable telephone magnetically isolated by an isolation apparatus according to the first embodiment of the invention.

Referring now to the drawings, wherein like numbers refer to like parts in several views, particularly to FIG. 1, there is shown a portable telephone having an electromagnetic Isolation structure according to the first embodiment of the invention.

The portable telephone includes a printed circuit board 10, a voltage-controlled oscillator (VCO) 11 which changes output frequency by changing tuning voltage, a temperature-compensated crystal oscillator (TCXO) 12 providing frequency stability, an amplifier 13 amplifying the voltage of a high-frequency signal, a modulator 14, a first shield case 15, a second shield case 16, a disc-shaped receiver 17 outputting a voice message from a calling party, a liquid-crystal display 18, a holder 19, an electronic motor 20 for providing vibrations to a telephone casing or body to indicate reception of a call, diaphragm switches 21, a key sheet 22, electronic components 23 such as resistors, diodes, capacitors, and transistors, a cover 24, a bottom casing 25, and a battery 28. The battery 28 is attached to a battery mounting flat portion 29 formed on a back surface of the bottom casing 25.

The printed circuit board 10 has formed on its front surface a first radio communication circuit including the VCO 11 and the TCXO 12 and on its back surface a second radio communication circuit including the amplifier 13 and the modulator 14.

The first and second shield cases 15 and 16, along with the printed circuit board 10 within which the first and second radio communication circuits are disposed, define enclosed chambers for preventing undesired electromagnetic waves or noise, generated for example by household electric equipment such as television or an electric washing machine or by business electronic equipment such as a copying machine or a printer, or high-frequency signals radiated from radio antennas around the telephone, from entering conductive lines on the printed circuit board 10 and causing a malfunction of the telephone. The enclosed chambers also prevent high-frequency signals radiated to the atmosphere from the VCO 11 and the TCXO 12 disposed on the printed circuit board 10 from entering surrounding electronic equipment, and causing a malfunction thereof.

Each of the first and second shield cases 15 and 16 is formed with a box-like member and made from resin material such as acrylonitrile, butadiene, ABS (styrene), PS (polystyrene), or PC (polycarbonate) and coated with copper in electroless plating. The copper plated layer is also coated with nickel in electro or electroless plating for the purpose of rust prevention. Each of the first and second shield cases 15 and 16 may alternatively be made from metallic plate such as a nickel silver, an iron, or a copper-plated plate and may also be applied with conductive material or coated with aluminum in vacuum deposition.

The diaphragm switches 22 are disposed on a portion of the front surface of the printed circuit board 10 below the VCO 11, as viewed in FIG. 1. The key sheet 22 on which characters and symbols are printed is disposed on the diaphragm switches 22. The electronic components 23 are mounted on a portion of the back surface of the printed circuit board 10 opposite to the diaphragm switches 22.

The telephone body consists of the cover 24 and the bottom casing 25. The cover 24 has formed therein a sound hole 26 through which a voice signal from the receiver 17 is transmitted outside the telephone body and a light-transmitting opening 27 through which the light from the display 18 is transmitted. The light-transmitting opening 27 is smaller in diameter than the liquid-crystal display 18.

Figure 2:
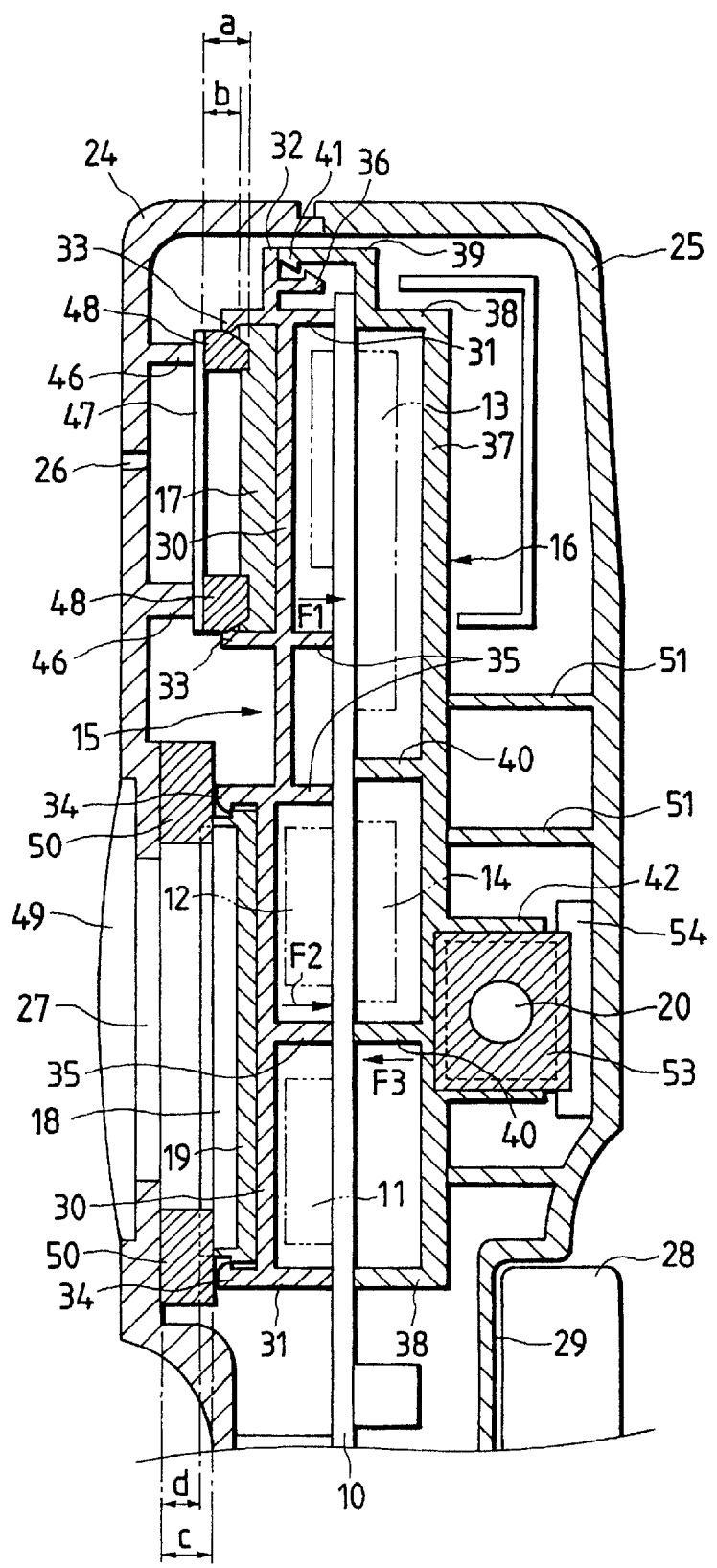
FIG. 2 is a partially expanded cross sectional view which shows an isolation apparatus in the portable telephone of FIG. 1.
Figure 3:
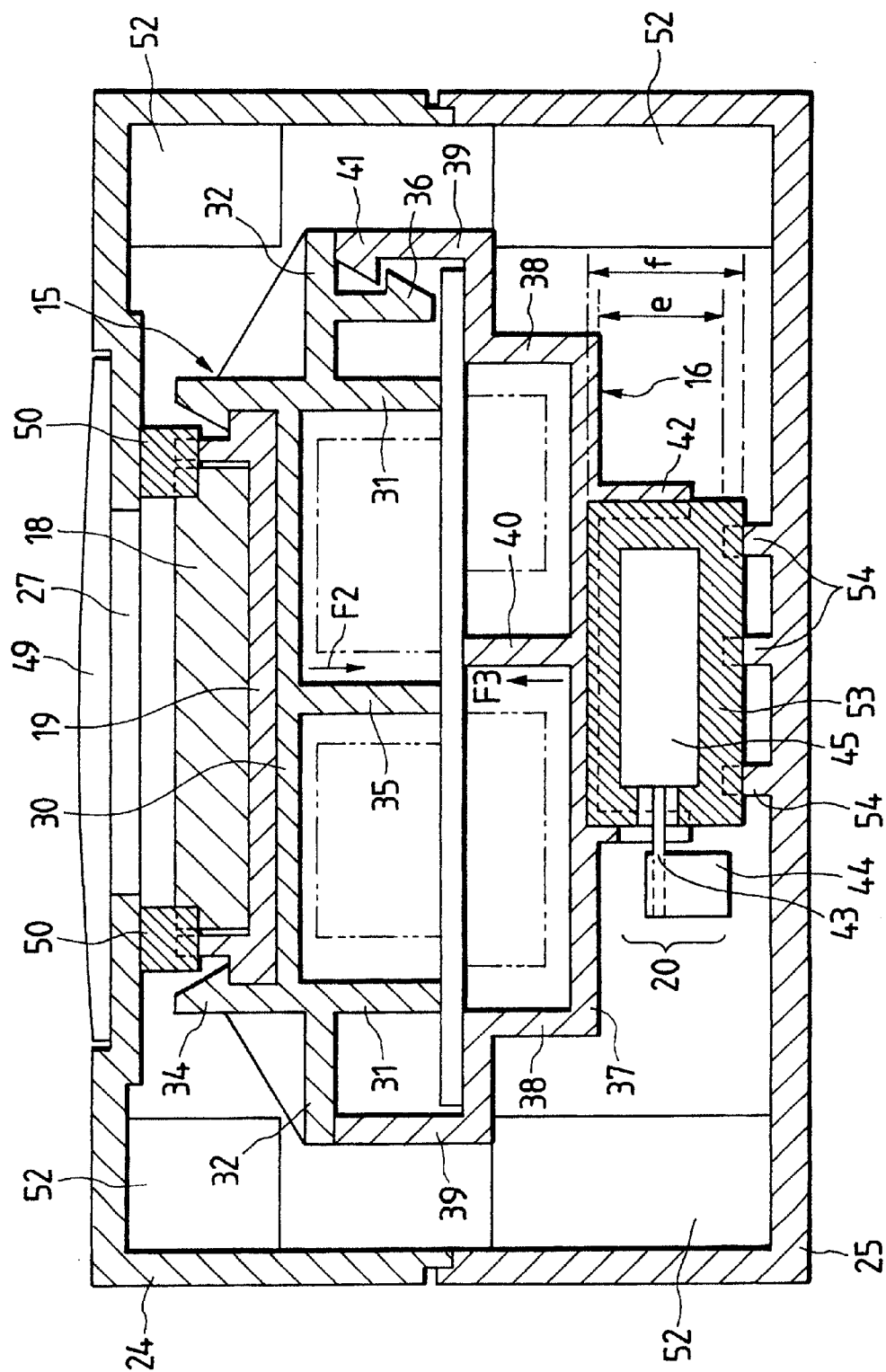
FIG. 3 is a horizontal cross sectional view which shows the portable telephone of FIG. 1.

The first shield case 15 is, as shown in FIGS. 2 and 3, formed with a first upper wall 30, side walls 31 surrounding the first upper wall 30, and edge walls 32 extending, as clearly shown in FIG. 3, from the side walls 31 outside an edge of the printed circuit board 10. The first upper wall 30 has formed thereon a plurality of barb-like claws 33 and 34 for retaining the receiver 17 and the holder 19 on which the rectangular display 18 is installed. The holder 19 is made from white or transparent resin which establishes multiple reflections of light emitted from a light-emitting diode (not shown) mounted on the printed circuit board 10 to illuminate the back surface of the display 18 for visually indicating numbers, characters, or symbols thereon.

The side walls 31 surround electronic components such as the VCO 11 and TCXO 12 mounted on the printed circuit board 10. The first upper wall 30 has formed on its inner surface a plurality of first rectangular ribs 35 to define enclosed chambers along with the side walls 31 for insulating the VCO 11, the TCXO 12, and other electronic components on the printed circuit board 10 from each other.

The edge walls 32 have formed thereon at given intervals a plurality of barb-like claws 36 engaging the second shielding case 16. Other portions of the edge walls 32 between the claws 36 may be in contact with or separate at small intervals from the second shielding case 16.

The second shielding case 16 is, as shown in FIG. 3, formed with a second upper wall 37, first side walls 38 surrounding the second upper wall 37, and L-shaped second side walls 39 extending from edges of the first side walls 38. The printed circuit board 10 is mounted on the edges of the first side walls 38 with a grounding conductor(s) printed on the printed circuit board 10 being in contact therewith. The second side walls 39 surround the edges of the printed circuit board 10.

The second upper wall 37 has formed on its inner surface a plurality of rectangular ribs 40 which extend inward on a level with the first side walls 38 to define enclosed chambers along with the first side walls 38 for insulating the amplifier 13, the modulator 14, and other circuit components mounted on the printed circuit board 10 from each other. Edges of the ribs 40 are also in contact with the grounding conductor(s) on the printed circuit board 10.

The second side walls 39 have formed thereon barb-like claws 41 to establish engagement with the claws formed on the first shielding case 15 above the printed circuit board 10.

In accordance with one aspect of the invention, the shield casing may include a holding portion, in which a device for providing vibrations may be installed.

For example, the second upper wall 37 of the second shielded case 16 may have, as shown in FIG. 3, a rectangular frame 42, formed on its outer surface defining a chamber within which the motor 20 may be mounted. The motor 20, as described above, provides vibrations to the telephone body to inform a telephone user of reception of a call and has a motor body 45 wrapped in a motor cushion 53 and a weight 44 supported eccentrically on an output shaft 43 thereof. As will become clear from the following description, motor cushion 53 may be an elastic member. The output shaft 43 extends substantially in parallel to the printed circuit board 10.

The cover 24 has formed on its inner surface an annular rib 46 facing the receiver 17. The nonwoven fabric cloth 47 is attached to the annular rib 46. A receiver cushion 48 is disposed on an edge of the rib 46 through the nonwoven fabric cloth 47. The receiver cushion 48 is formed with an annular elastic member made of chloroprene rubber, polyurethane rubber, natural or synthetic rubber, urethane rubber, or silicone rubber which is proof against sound, dust, and water. The annular rib 46 is smaller in outer diameter than the receiver cushion 48, while it is greater in inner diameter than the receiver cushion 48. Specifically, the receiver cushion 48 covers the whole of the edge of the annular rib 46.

The thickness a, as shown in FIG. 2, of the receiver cushion 48 is greater than a first clearance b that is the interval between the edge of the annular rib 46 and the surface of the receiver 17. This results in elastic deformation of the receiver cushion 48 between the edge of the annular rib 46 and the surface of the receiver 17 to produce pressure urging the first shield case 15 toward the printed circuit board 10. The thickness of the nonwoven fabric cloth 47 is much smaller than that of the receiver cushion 48.

A transparent window 49 is installed in the cover 24 so as to cover the light-transmitting opening 27. A hollow rectangular liquid-crystal display cushion 50 is attached to the inner wall of the cover 24 outside the light-transmitting opening 49 in constant engagement with the outer surface of the display 18 and is made of an elastic material such as polyurethane foam, polyethylene foam, polystyrene foam, chloroprene rubber, polyurethane rubber, natural or synthetic rubber, urethane rubber, or silicone rubber.

The thickness c, as shown in FIG. 2, of the liquid-crystal display cushion 50 is greater than a second clearance d that is the interval between the inner surface of the cover 24 and the display 18 (i.e., the upper edge of the holder 19). This results in elastic deformation of the liquid-crystal cushion 50 between the inner surface of the cover 24 and the display 18 (the holder 19) to produce pressure urging the first shield case 15 toward the printed circuit board 10.

The cover 24 also has a plurality of guide members 52, as shown in FIG. 3, formed on the inner surface thereof at small intervals away from the first shield case 15. The guide members 52 serve to position the first and second shield cases 15 and 16 within the telephone body.

The bottom casing 25 has formed on the back surface thereof the battery mounting flat portion 29 on which the battery 28 is mounted, and has on the inner surface thereof a plurality of support ribs 51, as shown in FIG. 2, which support the second upper wall 37 of the second shield case 16 at a given level. The bottom casing 25 also has formed on the inner surface thereof pressure ribs 54, as clearly shown in FIG. 3, extending perpendicular to the output shaft 43 of the motor 20 in constant engagement with the motor body 45 through the motor cushion 53.

The height of each of the pressure ribs 54 is so determined that the height f of the motor cushion 53 is greater than the third clearance e that is the interval between an end of each of the pressure ribs 54 and the second upper wall 37 of the second shield case 16. This results in elastic deformation of the motor cushion 53 between the second upper wall 37 of the second shield case 16 and the pressure ribs 54 to produce pressure urging the second shield case 16 toward the printed circuit board 10.

Specifically, the elastic deformation of the receiver cushion 48, the liquid-crystal cushion 50, and the motor cushion 53 produces elastic pressure acting on the first and second shield cases 15 and 16 inward of the telephone body to establish constant conductive communications between the first and second shield cases 15 and 16 and between the printed circuit board 10 and the first and second shield cases 15 and 16.

In this embodiment, the first and second shield cases 15 and 16 are attached to each other through the claws 36 and 41 provided on three of the side walls of each of the first and second shield cases 15 and 16 to surround a portion of the printed circuit board 10, however, may alternatively surround the whole of the printed circuit board 10 by the four side walls of each of the first and second shield cases 15 and 16 to isolate it electromagnetically from the outside of the first and second shield cases 15 and 16.

In assembling of the above described portable telephone, the printed circuit board 10 is first disposed between the first and second shield cases 15 and 16. The first and second shield cases 15 and 16 are pressed to bring the claws 36 and 41 into engagement with each other. The printed circuit board 10 is thus mounted on the first side walls 38 of the second shield case 16. The second shield 16 case engages at the upper edges of the second side walls 39 the edge walls 32 of the first shield case 15. The side walls 38, the first and second rectangular ribs 35 and 40 are placed in conductive engagement with the grounding conductor(s) on the printed circuit board 10.

Next, the motor body 45 of the motor 20 is wrapped in the motor cushion 53 and then fitted into the frame 42 with the weight 44 projecting from the frame 42. This preassembly is then put into the bottom casing 25 with the back surface of the printed circuit board 10 facing the bottom casing 25.

Finally, the key sheet 22 is put on the printed circuit board 10. The disc-shaped receiver 17 is installed by the claws 33. The holder 19 in which the liquid-crystal display 18 is mounted is held by the claws 34. The cover 24 having attached thereto the nonwoven fabric cloth 47, the receiver cushion 48, and the liquid-crystal display cushion 50 is fitted on the bottom casing 25.

When the second shield case 16 is mounted on the support ribs 51 of the bottom casing 25, the height f of the motor cushion 53 is, as shown in FIG. 3, greater than the third clearance e, so that the motor cushion 53 is partly compressed by an amount of (f−e) to produce elastic pressure F3 which urges the second shield case 16 onto the printed circuit board 10.

The motor 20, when turned on, rotates the eccentric weight 44 on the output shaft 43 to produce the centrifugal force which is, in turn, transmitted as vibration to the telephone body through the motor cushion 53 to inform a telephone user of reception of a call.

The thickness a of the receiver cushion 48 is greater than the first clearance b, so that the receiver cushion 48 is compressed between the receiver 17 and the inner wall of the cover 24 by an amount of (a−b) to produce elastic pressure F1, as shown in FIG. 2, which urges the first shield case 15 into constant engagement with the printed circuit board 10. A substantially enclosed chamber is defined by the receiver 17, the annular rib 46, and a portion of the inner wall of the cover 24 surrounded by the annular rib 46. The enclosed chamber is isolated from other spaces within the telephone body and communicates with atmosphere only through the sound hole 26. Specifically, the sound produced by the receiver 17 is transmitted outside the telephone body through the sound hole 26. Dust entering the enclosed chamber through the sound hole 26 is caught by the nonwoven fabric cloth 47.

The thickness c of the liquid-crystal cushion 50 is greater than the second clearance d, so that the liquid-crystal cushion 50 is partly compressed between the inner wall of the cover 24 and the liquid-crystal display 18 and the holder 19 by an amount of (c−d) to produce elastic pressure F2, as shown in FIG. 2, which urges the first shield case 15 into constant engagement with the printed circuit board 10. This also defines an enclosed chamber between the liquid-crystal display 18 and the transparent window 49 which blocks entry of dust from the outside.

Therefore, as described above, the elastic deformations of the receiver cushion 48, the liquid-crystal cushion 50, and the motor cushion 53 produce the elastic pressures F1, F2, and F3 urging the first and second shield cases 15 and 16 towards the printed circuit board 10. This brings the edge walls 32 of the first shielding case 15 into engagement with the second side walls 39 of the second shield case 16 and establishes electrical communications between the first rectangular ribs 35 and the side walls 31 of the first shield case 15 and the grounding conductor(s) on the printed circuit board 10 and between the second rectangular ribs 40 and the edges of the first side walls 38 of the second shield case 16 and the grounding conductor(s) on the printed circuit board 10.

The edge walls 32 of the first shield case 15 may alternatively be separate from the second side walls 39 of the second shield case 16 through a small gap. The inventors of this application have experimentally found that when such a small gap is less than or equal to 0.5 mm, and a wall is provided between the gap and electronic components in a portable telephone used within a band of 8000 MHz, for example, the electronic components are insulated from unwanted electromagnetic waves or noise. In this embodiment, that wall corresponds to the side wall 31 of the first shield case 15 provided inside the second side wall 39 of the second shield case 16.

The above isolation structure avoids radio interference near the conductive lines on the printed circuit board 10, so that the potential of the conductive lines on the printed circuit board 10 is not adversely affected by unwanted electromagnetic waves. This maintains the accuracy of modulation of, for example, the VCO 11 without lowering the ability of radio communication.

Figure 4:
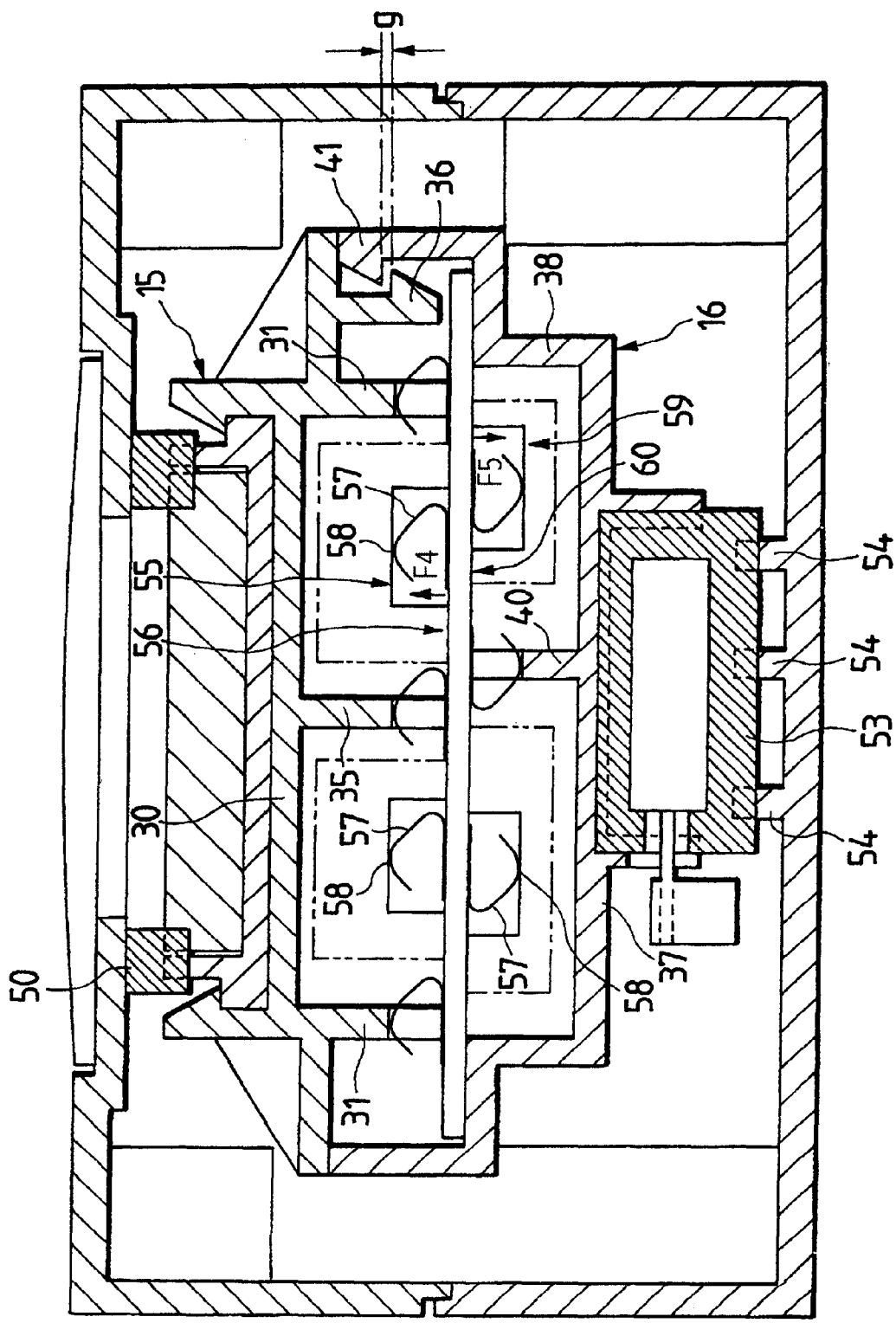
FIG. 4 is a horizontal cross sectional view which shows an isolation apparatus according to the second embodiment of the invention.
Figure 5:
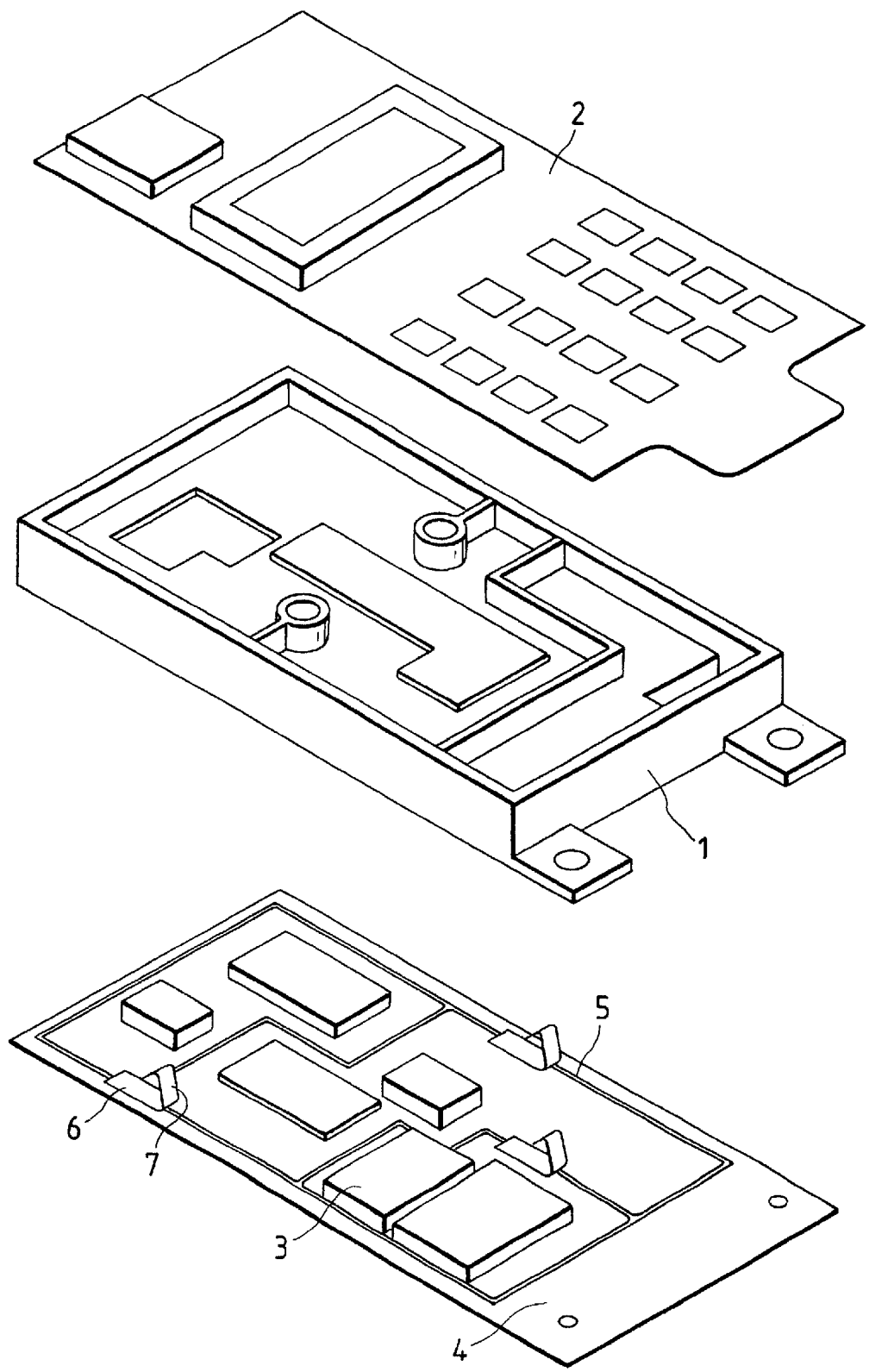
FIG. 5 shows a radio terminal unit having a conventional isolation structure.

FIG. 4 shows an electrical isolation structure for a portable telephone according to the second embodiment of the invention which is different from the above first embodiment in that a plurality of springs 57 are disposed between the first shield case 15 and the printed circuit board 10 and between the second shield case 16 and the printed circuit board 10. Other arrangements are identical, and explanation thereof in detail will be omitted here.

A plurality of first recessed portions 55 having the same depth are formed at given intervals in ends of the side walls 31 and the first rectangular ribs 35 extending from the first upper wall 30 of the first shield case 15. Similarly, a plurality of second recessed portions 59 are formed at given intervals in ends of the second rectangular ribs 40 extending from the second upper wall 37 of the second shield case 16.

The springs 57 made of beryllium steel or phosphor bronze are disposed within the first and second recessed portions 55 and 59 one in each in electrical contact with the grounding conductor(s) on the printed circuit board 10. The springs 57 are slightly compressed between the recessed portions 55 and 59 and the surfaces of the printed circuit board 10 to produce reaction pressures urging the first and second shield cases 15 and 16 into disengagement from the printed circuit board 10. Each of the springs 57 may be soldered to the grounding conductor of the printed circuit board 10 or alternatively may be bonded at a curved portion 58 to one of the first and second recessed portions 55 and 59.

Flat edge portions 56 and 60 defined between the first and second recessed portions 55 and 59 are in electric contact with the grounding conductor(s) on the printed circuit board 10.

In assembling of the above described portable telephone, when the first and second shield cases 15 and 16 are fitted to each other with the printed circuit board 10 being disposed therebetween, the engagement of the claws 36 and 41 compresses the curved portions 58 of the springs 57 to produce reaction pressures F4 and F5 acting on the first and second recess portions 55 and 59 of the first and second shield cases 15 and 16 in opposite directions, which eliminates the clearance g between the claws 36 and 41 to bring the claws 36 and 41 into constant engagement with each other.

Next, the motor body 45 of the motor 20 is wrapped in the motor cushion 53 and then fitted into the frame 42. The disc-shaped receiver 17 is fitted to the claws 33. The holder 19 in which the liquid-crystal display 18 is mounted is fitted to the claws 34. The cover 24 having attached thereto the nonwoven fabric cloth 47, the receiver cushion 48, and the liquid-crystal display cushion 50 is fitted on the bottom casing 25.

The motor cushion 53 is compressed between the second shield case 16 and the pressure ribs 54 to produce the elastic pressure F3, as discussed above with reference to FIG. 3, which urges the second shield case 16 onto the printed circuit board 10. The elastic pressure F3 is set greater than the pressure F5 produced by the springs 57 installed in the second recessed portions 59 of the second shield case 16, which establishes conductive engagement of the first side walls 38 of the second shield case 16 and the flat edge portions 60 of the second rectangular ribs 40 with the printed circuit board 10 and which compresses the springs 57 within the second recessed portions 59 to establish conductive engagement of the second recessed portions 59 with the printed circuit board 10.

The receiver cushion 48 is, as discussed above, compressed between the cover 24 and the receiver 17 to produce the elastic pressure F1 urging the first shield case 15 toward the printed circuit board 10. Similarly, the liquid-crystal cushion 50 is also compressed between the cover 24 and the holder 19 to produce the elastic pressure F2 urging the first shield case 15 toward the printed circuit board 10. The elastic pressures F1 and F2 are so determined as to meet relations of F1>F5, F2>F5, and (F1+F2)>F5. This establishes conductive engagement of the side walls 31 of the first shield case 15 and the flat edge portions 56 of the first rectangular ribs 35 with the printed circuit board 10 and compresses the springs 57 within the first recessed portions 55 to establish conductive engagement of the first recessed portions 55 with the printed circuit board 10.

Specifically, the springs 57 of this embodiment, as apparent from the above discussion, serve to establish constant engagement of the first and second shield cases 15 and 16 with the grounding conductor(s) on the printed circuit board 10 even if the first and second shield cases 15 and 16, for example, the first and second ribs 35 and 40 are deformed or curved, which will develop gaps between themselves and the printed circuit board 10.

Additional springs may be disposed between the first side walls 38 of the second shield case 16 and the printed circuit board 10 to increase the conductive engagement of the second shield case 16 with the printed circuit board 10.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

We claim:

1. An electromagnetic apparatus comprising:

a printed circuit board;

a circuit including a radio communication section printed on said printed circuit board;

a vibration generating device including a motor and an eccentric weight; and a shield casing covering the circuit of said printed circuit board;

wherein said shield casing is connected with ground through said printed circuit board, and said shield casing is disposed between the radio communication section of the circuit of said printed circuit board and said vibration generating device, and wherein said shield casing comprises a holding portion formed therein, and said vibration generating device is covered with an elastic member and is installed in the holding portion of said shield casing.

* * * * *